United States Patent [19]

Matthews

[11] Patent Number: 5,429,251

[45] Date of Patent: Jul. 4, 1995

[54] SEMICONDUCTOR WAFER END EFFECTOR

[75] Inventor: Robert R. Matthews, Richmond, Calif.

[73] Assignee: Legacy Systems, Inc., Richardson, Tex.

[21] Appl. No.: 124,248

[22] Filed: Sep. 22, 1993

[51] Int. Cl.6 .............................................. A47F 7/00
[52] U.S. Cl. ..................................................... 211/41
[58] Field of Search .................. 211/41; 206/334, 454; 118/500

[56] References Cited

U.S. PATENT DOCUMENTS

| | | |
|---|---|---|
| 3,826,377 | 7/1974 | Bachmann ........................... 211/41 |
| 4,053,294 | 10/1977 | Sullivan . |
| 4,471,716 | 9/1984 | Milliren . |
| 4,493,418 | 1/1985 | Johnson . |
| 4,515,104 | 5/1985 | Lee . |
| 4,566,839 | 1/1986 | Butler ............................... 211/41 X |
| 4,687,097 | 8/1987 | Mortensen . |
| 4,724,963 | 2/1988 | Mortensen . |
| 4,949,848 | 8/1990 | Kos . |
| 4,981,222 | 1/1991 | Lee . |
| 5,111,936 | 5/1992 | Kos . |

*Primary Examiner*—Ramon O. Ramirez
*Assistant Examiner*—Sarah L. Purol
*Attorney, Agent, or Firm*—Burns, Doane, Swecker & Mathis

[57] ABSTRACT

An end effector for holding or carrying semiconductor wafers during wet processing is disclosed. The end effector holds a plurality wafers with only two points of contact intruding onto the front or back surface of the wafer, holding the wafer with substantially no movement during processing at a slight angle from vertical.

10 Claims, 2 Drawing Sheets

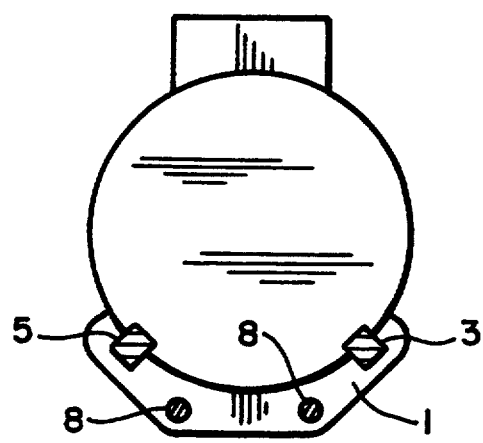
FIG_1
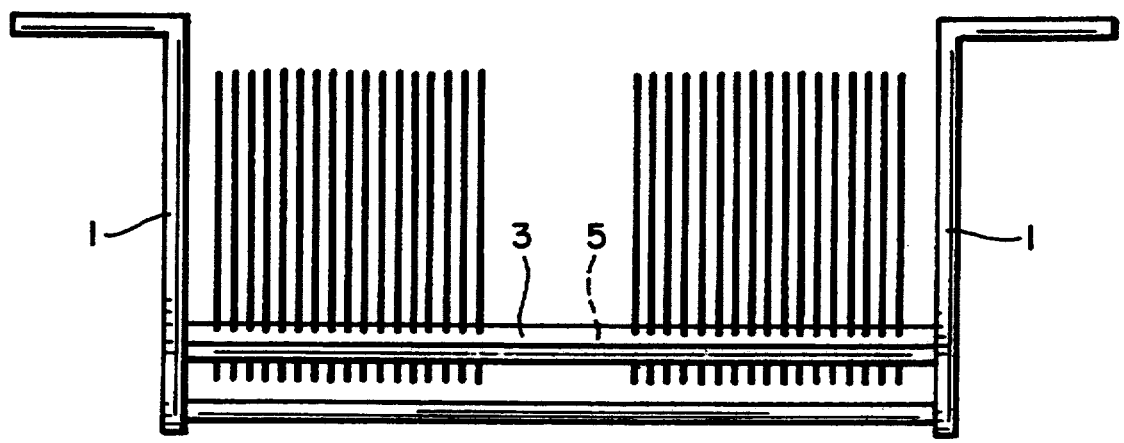
FIG_2
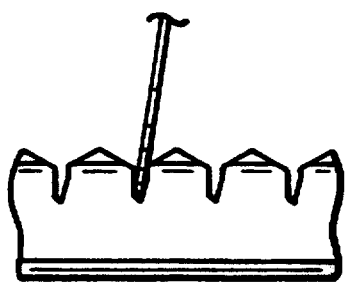
FIG_3
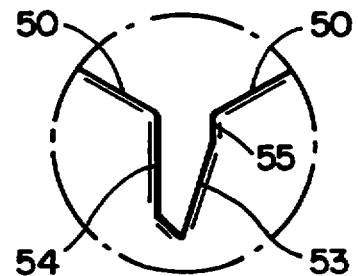
FIG_4

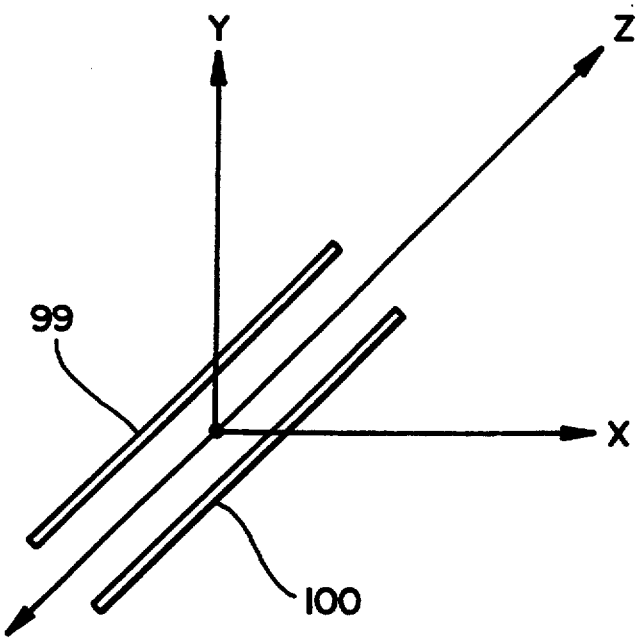
FIG_5
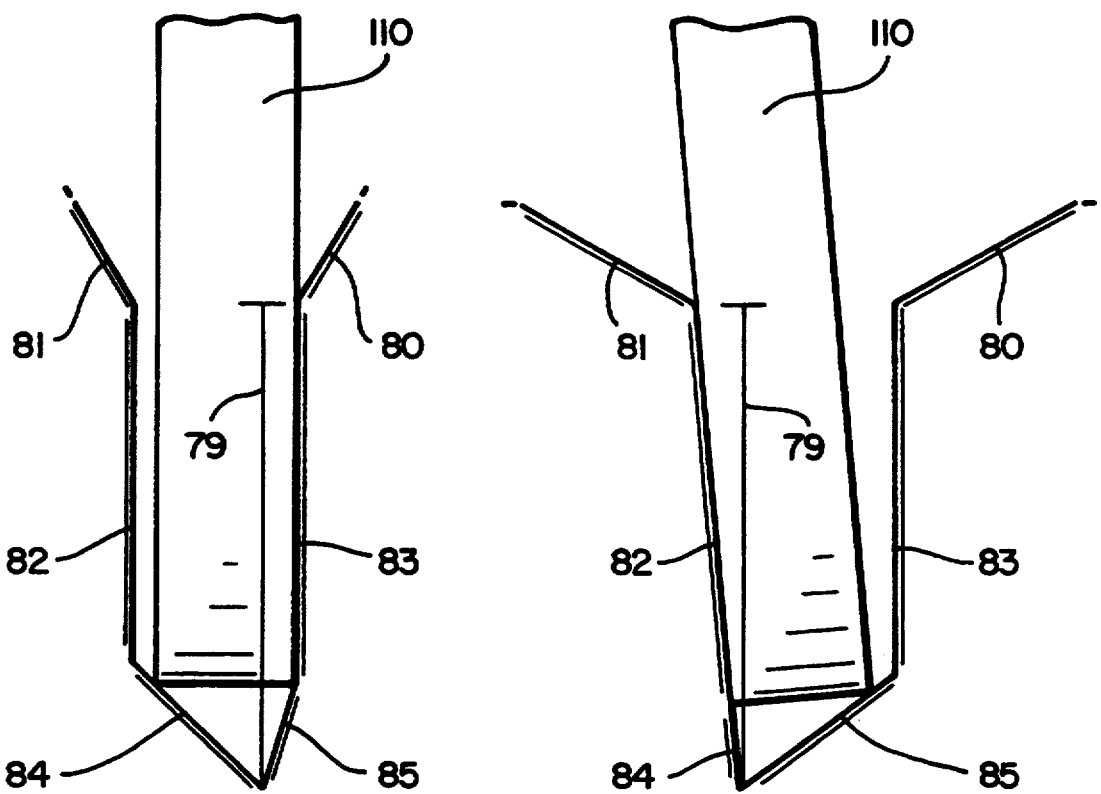
FIG_6  FIG_7

SEMICONDUCTOR WAFER END EFFECTOR

FIELD OF THE INVENTION

The present invention relates to semiconductor manufacturing. Specifically, the present invention relates to an end effector for supporting semiconductor wafers during wet processing.

BACKGROUND OF THE INVENTION

During wet processing of semiconductor wafers, the wafers are exposed to various reagents. Examples of such process steps include etching, photoresist stripping, and prediffusion cleaning. After cleaning, the semiconductors are rinsed and dried. In order to process wafers efficiently, they must be suspended in the various reagents with some type of holder or carrier.

End effectors are also referred to in the art as boats, carriers, rigs, cassettes, etc.

Semiconductor wafer carriers are used in several different types of processing. For example, there is high temperature diffusion processing that is carried out at temperatures from 600° to 1200° C. There is also wet processing which is carried out at temperatures less than 180° C. The high temperatures of diffusion processing require that a wafer carrier designed for use in diffusion processing must provide for substantial expansion and warping of the wafer. In wet processing, expansion is not a concern. Other concerns that mandate carrier design include; (1) even and adequate contact of the wafer surfaces with the reagents, and (2) the avoidance of trapping gases under the rails of the end effector as the end effector is lowered into the liquid. This gas can be released later and enter a trench on the semiconductor wafer and block cleaning or etching of the area under the bubble.

Manual wet processing treatment typically makes use of a regular wafer boat or wafer cassette to which a boat handle is attached for introducing and removing the boat from the process chemistry. The standard wafer boat for eight inch wafers has a groove larger than the width of the wafer thickness. The wafers move back and forth within their slots during wet processing. The standard boat configuration for an eight inch low profile cassette cups the entire lower half of the wafer with a six mm intrusion onto the wafer surface. The standard configuration for a high profile cassette contacts ⅜ inch of the wafer diameter. Typically, boats are made of a fluoropolymer material, peek, or quartz.

In automated wet processing, the typical boat, transport rack or cassetteless processing grips the wafer with an end effector using a standard six mm deep v shaped groove that cups the wafers or holds them with a minimum of 4 points of contact.

Wherever the surface of a wafer comes into contact with the wafer carrier, there exists the possibility for imperfections in the surface of the wafer which lowers overall yield. Most of the above carriers and other prior wafer carriers fall into one of three categories, namely, "four member" carriers, "three member" carriers and "shell boats". All of these designs have a great deal of wafer surface to carrier contact. For instance, a four member carrier usually has four points of contact that intrude onto the wafer surfaces. A shell boat has contact with a wafer around the entire periphery of the wafer.

U.S. Pat. Nos. 4,493,418, 4,687,097, 4,471,716, 4,724,963, 4,949,848, and 5,111,936 are characteristic of wafer processing cassettes known in the art for the wet processing of wafers. In each of these patents, the wafers are held in place by cassettes that have a great deal of contact with the wafer surfaces. In addition to the large regions of intrusion onto the wafer surfaces, these cassettes hold the wafers vertical with no disclosed leaning angle.

Some of the wafer processing carriers or cassettes known in the art of high temperature diffusion disclose cassettes that hold wafers at a leaning angle from vertical. However, these cassettes or carriers do not tightly hold the wafers with minimal intrusion onto the wafer surfaces. Moreover, this design has not been employed in carriers designed for wet processing.

U.S. Pat. No. 4,981,222 ("the '222 patent") discloses a wafer supporting method and apparatus having at least two wafer supporting slots for each edge-wise oriented wafer in a plurality of coaxial edge-wise aligned wafers as depicted in FIG. 1 of the '222 patent. The wafers are supported by either 3 or 4 round rods as depicted in FIGS. 3, 5 and 6 of the '222 patent as well as column 4, lines 34–35 and column 6, lines 14–18. The wafer carriers disclosed are made of quartz and are designed for diffusion processing at high temperatures and allow for edge to edge and front to back translational movement during processing and handling.

Each slot of the '222 patent has a pair of inwardly directed bevels at the upper entrance level that may be at an angle of about 45° to 60° from the slot's geometrically-centered axis. The bevels lead downwardly into a pair of parallel slot walls that are spaced apart by about twice the thickness —2t— of the wafer. The rightmost wall is tangent to an arcuate-shaped bottom wall circle having a radius of —2t—, where t is the thickness of a wafer to be held in the slot. The longer wall of the parallel slot walls is the wall against which the wafer will lean. Gravity will cause the wafer to drop to the lowest point at the rounded bottom of the slot. Accordingly, the '222 patent discloses a wafer cassette having slots which are twice the width of the thickness of the wafer and a rounded bottom wall thereby holding the wafer loosely in place by the force of gravity.

U.S. Pat. No. 4,515,104 discloses a quartz boat for diffusion processing formed with a plurality of spaced parallel rods having slots for supporting a series of semiconductor wafers in a generally edgewise, spaced, parallel position. The slots continue to the ends of the rods, and the cross member supporting the rods are spaced inwardly from the rod ends, such that a series of boats may be arranged with the rods in end-to-end relation and the wafer space between adjacent boats is the same as the wafer space in the middle of a boat. Little detail is disclosed regarding the shape of the slots or the freedom of movement the wafers have when seated in the slots. The drawings disclose a boat with 4 points of contact intruding onto the wafer surfaces.

U.S. Pat. No. 4,053,294 discloses a semiconductor boat or carrier with three slotted points of contact intruding onto the wafer surfaces. The grooves are beveled and symmetrical about the centerline of the groove.

A problem associated with most of the above-described designs is that die yield at the edges of the wafers is sacrificed because the active surface area of each wafer is diminished by the intrusion of the end effector. The further the end effector intrudes into the wafer surface, the larger the area on the outer surface of the wafer that is rendered useless. Particle generation can also be a problem where the wafers are free to move around within the grooves. The wafers rattle about within the grooves, colliding with the inner surfaces of the groove thereby chipping away at the wafer or the rack which produces particulate contamination.

Another problem with boats such as those above-described is that they are difficult to clean. The greater the number of grooves, the more difficult the carrier is to clean. Also, cassettes with deep grooves are more difficult to clean. Horizontal surfaces and points where rods connect result in places that trap liquids and particles.

Another problem with many of the above-mentioned wafer carriers is that they are made of materials which have undesirable properties for wet processing. For instance, teflon absorbs process chemicals which are later outgassed, forming a haze or unwanted etching on the surfaces of the adjacent wafers as well as damage to other equipment downstream of the wet station. Teflon also creates particulate contamination thereby decreasing wafer yield. Teflon is soft and is easily scored by silicon wafers and this can create particle contamination as well as trap the edge of the wafer within the teflon. This can lead to wafer breakage when the wafer is moved perpendicular to the direction it is held or trapped (which frequently occurs in a spin dryer). Carriers made from PEEK (poly ethyl ether ketone) are not suitable for processes completed at or above 100° C. such as piranha or phosphoric cleaning. Quartz carriers are too fragile and the grooves deteriorate. This often leads to adherence of the wafer to the quartz. Removal of a disc that has adhered to the quartz carrier usually results in breakage of the wafer. Also, quartz carriers are incompatible with hydrofluoric acid.

Accordingly, it is an object of this invention to provide for an end effector that holds a plurality of wafers tightly with only two points of contact that minimally intrude onto the wafer surfaces.

It is further an object of the present invention to design a wafer end effector that is easily cleaned.

It is further an object of the present invention to design a wafer end effector that holds a plurality of wafers at a slight angle from vertical.

It is yet another object of the present invention to provide a lightweight, sturdy end effector made of a material which minimizes particle generation and is chemically inert.

These and other objects of the present invention will become apparent upon a review of the following specification and the claims appended thereto.

SUMMARY OF THE INVENTION

The foregoing objectives are achieved by an end effector for supporting one or more semiconductor wafers during wet processing comprising two parallel, grooved engaging rails having corresponding linearly aligned angled grooves adapted to engage and support a wafer at an angle from perpendicular to the rails, means for rigidly supporting the parallel rails in a parallel configuration, and a non-symmetrical gripper means for association with the grooves holding the wafer at the angle from perpendicular with substantially no movement during wet processing.

BRIEF DESCRIPTION OF THE DRAWINGS

FIG. 1 depicts a head-on view of an end effector according to the present invention.

FIG. 2 is a side view of the end effector of FIG. 1.

FIG. 3 depicts the angled grooves with the non-symmetrical gripping means of the present invention at the bottom of the grooves.

FIG. 4 is a magnified view of a single angled groove of FIG. 3.

FIG. 5 is a view of the parallel slotted engaging rails on an x, y, z axis.

FIG. 6 depicts one embodiment of the angled grooves of the present invention.

FIG. 7 depicts yet another embodiment of the angled grooves of the present invention.

DETAILED DESCRIPTION OF THE PREFERRED EMBODIMENTS

The apparatus of the present invention is an end effector for supporting one or more semiconductor wafers during wet processing comprising two parallel, grooved engaging rails having corresponding linearly aligned angled grooves adapted to engage and support a wafer at an angle from perpendicular to the rails, means for rigidly supporting the parallel rails in a parallel configuration, and a non-symmetrical gripper means for association with the grooves holding the wafer at the angle from perpendicular with substantially no movement during wet processing.

The end effector of the present invention is made from any substance chemically inert and resistant to cracking, chipping, flaking or other particle generation. This includes quartz, peek, teflon, other fluoropolymers and, preferably, a woven carbon composite which has either a CVD or sputtered coating to eliminate particle generation and ensure chemical inertness. Without such a coating, materials such as teflon may blister over time from continued exposure to cleaning using megasonics. Blistering then leads to shedding of particulates. The coating will vary depending on the liquid in use and the temperature range. The coatings include silicon nitride, carbon nitride, polysilicon, silicon carbide and a carbon coating. These coatings do not absorb chemicals in contrast to materials such as teflon. Performance is optimized for different processing chemicals by selecting the proper coating. Accordingly, metals leaching from the boats into the chemical baths and partial shedding or breakdown of the end effectors can be minimized by the use of the proper coating.

The two point wafer contact end effector with 2 mm or less intrusion of the present invention increases the active wafer surface or number of devices which can be manufactured on the wafer surface. Other advantages include: (1) the elimination of shielding of the wafers in in-situ gas generated liquid processing, such as that disclosed in copending application Ser. No. 08/092,523, hereby incorporated by reference, (2) increased cleaning efficiency, for example, with megasonic cleaning action because there is less interference from the end effector with the cleaning process, (3) the amount of liquid dragged out of solution and carried over to the next process tank is minimized, and (4) drying efficiency is maximized because there are no horizontal surfaces to trap liquids or particles and particulates are minimized.

The basic structure of the end effector according to the present invention includes a set of two grooved parallel rails rigidly supported by a means for rigidly supporting the parallel slotted rails such that the parallel formation of the rails is maintained.

By parallel formation it is meant that on an x, y, z axis where the rails lie horizontal to the x, z plane, the rails are parallel when viewed from the y-axis. This is depicted in FIG. 5. In FIG. 5, it can be seen that rails (99) and (100) in the x, z plane are parallel when viewed from the y-axis.

The parallel grooved rails may have any of a variety of shapes when viewed from an end. For instance, the rail may be in the form of a dowel having a circular end. The rails may also be hollow. The rail may have a square or rectangular shape when viewed from an end. Thus, the particular shape of the rail when viewed from an end is not critical to the invention so long as the combination of rails is parallel and evenly spaced. However, a diamond shaped, or circular rail is preferred to eliminate liquids adhering to the end effector. The diamond shaped rail has points of the diamond being located at 0, 90, 180 and 270 degrees from the 12 o'clock position when viewed from an end to facilitate liquid sheeting of the rails. The square or horizontal surfaces when viewed from the top can be detrimental to liquid processing because they tend to trap liquids.

The grooved rails are supported by a means for rigidly supporting the parallel rails in a parallel configuration. This can be accomplished by any number of structures well known in the art. In one embodiment depicted in FIGS. 1 and 2, a pair of endplates (1) are rigidly fastened to parallel rails (3) and (5). This could also be accomplished by other structures such as end blocks with receiving slots for the parallel grooved rails or support rails running between the parallel grooved rails.

The rails are spaced apart at a distance such that the each rail engages and supports the edge of the bottom half of a wafer at point along the circumference about 45° to each side of bottom center. It should be appreciated that the particular angle of engagement from bottom center about the circumference of the wafer is not critical to the present invention. However, the wafer is preferably only supported by two points below the horizontal centerline of the wafer. When looking at the surface of the 200 mm wafer, the first contact point would be any point less than the 9 o'clock position, but greater than the 6 o'clock position. Likewise, the second point would be any point less than the 6 o'clock position, but greater than the 3 o'clock position. In practice the two points are chosen to be equidistant about the lower arc of the circle, such as 5 and 7 o'clock positions or 4 and 8 o'clock positions, but they are not required to be equidistant. For instance, points of contact at 4 o'clock and 7 o'clock would work.

Each of the parallel grooved engaging and supporting rails has a series of angled grooves for receiving wafers at an angle θ from perpendicular to the rails. Accordingly, each groove on one engaging rail has a corresponding aligned angled groove on the other engaging rail such that a wafer supported by the engaging rails sits in a linearly corresponding angled groove in each engaging rail. Angle θ can be between 1°-8° from perpendicular and is preferably between 1° and 5° from perpendicular.

The non-symmetrical gripper means according to the present invention is comprised of any number of tapered cuts forming the above-mentioned grooves. The gripper means should be unsymmetrical about a vertical line drawn from the deepest point in the groove up a point level with the top of the groove.

FIG. 3 depicts a series of angled grooves as they appear on the surface of a single grooved rail of one embodiment of the present invention. FIG. 4 depicts a magnified view of a single groove from FIG. 3. As seen in FIG. 4, each groove has a flaired portion (50) on each side of the top of the groove. Each groove also has an non-symmetrical gripper means which is comprised of right taper (53) and left taper (54). Tapers (53) and (54) are cut at such an angle that they provide an non-symmetrical seat for receiving a wafer. The tapers may be comprised of one or more distinct surfaces that intersect to form the bottom of the groove. The specific cut of the tapers or number of taper cuts is not critical to the present invention so long as the non-symmetrical gripper means is capable of holding the wafer at a slight angle from vertical with substantially no movement during processing. In this regard, an additional taper (55) is depicted in FIG. 4.

FIG. 6 depicts one embodiment of the angled grooves of the present invention. Depth (79) is the total depth of the groove which is 3.175 mm. Flairs (80) and (81) are angled about 30° to either side of vertical, meeting first taper surfaces (82) and (83) which in turn meet second taper surfaces (84) and (85). Taper surfaces (84) and (85) are cut at different angles such that each taper surface is a different length. The non-symmetrical nature of the gripper means enables the groove to hold the wafer with substantially no movement during processing at a slight angle from vertical.

FIG. 7 depicts yet another embodiement of the present invention with an alternative groove design.

Both FIGS. 6 and 7 depict the holding of wafer 110. As seen in the figures, the wafers only have three contacts with the groove, of which only one contact touches the surface of the wafer. The other two contacts are with the outer edges of the wafer. Accordingly, die yield is maximized. Preferably, only the back surface of the wafer is in contact with the groove as depicted in FIG. 4.

By substantially no movement during processing it is meant that the wafers do not slide or rattle around within the grooves during processing. The wafers are held tight and firm such that there is little or no room for expansion of the wafer. The wafer is not free to move within the slots.

It is also important that the grooves of the present invention provide minimal intrusion onto the surface of the wafer. As set forth above, for example, this means a maximum intrusion of 2 mm for a 20 cm wafer. Preferably, the intrusion is close to 1 mm as opposed to prior art end effectors which have 6 mm intrusion. The intrusion onto the surface of the wafer is the distance onto the front or back surface of the wafer which has contact with the groove or gripper means of the present invention. A minimal intrusion enhances product yield.

In one embodiment of the present invention, one or more additional supporting non-engaging parallel rails are included. The additional non-engaging rails parallel to the two engaging rails, sit at points corresponding to the circumference of the bottom half of the wafer between the two engaging parallel rails as shown in FIG. 1 at (8). The additional rail or rails do not engage the surfaces of the wafer as do the engaging parallel rails. They merely provide structural rigidity to the end effector. They are not in contact with the wafer. They provide for rigidity in the "Z" direction when attached to the endplates.

While this invention has been illustrated and described in accordance with a preferred embodiment, it is recognized that variations and changes may be made therein without departing from the invention as set forth in the claims.

What is claimed is:

1. An end effector for supporting one or more semiconductor wafers during wet processing with only two points of contact, comprising:

two parallel, grooved engaging rails having corresponding linearly aligned angled grooves adapted to engage and support a wafer at an angle $\theta$ from perpendicular to said rails;

means for rigidly supporting said parallel rails in a parallel configuration; and a non-symmetrical gripper means for association with said grooves holding said wafer at the angle $\theta$ from a perpendicular with substantially no movement of the wafer in the grooves during wet processing.

2. The end effector of claim 1, further comprising one or more non-engaging rails parallel to said parallel grooved engaging rails.

3. The end effector of claim 1, wherein said rigid supporting means includes two end plates attached to said parallel engaging rails.

4. The end effector of claim 1, wherein said end effector is made of a woven carbon fiber composite.

5. The end effector of claim 1, further comprising a coating which is applied by chemical vapor deposition or sputtering, wherein said coating is polysilicon, silicon nitride, silicon carbide, carbon or carbon nitride.

6. The end effector of claim 1, wherein said non-symmetrical gripping means includes a plurality of tapered surfaces cut at different angles such that said grooves have an non-symmetrical appearance.

7. The end effector of claim 1, wherein said angle $\theta$ from a perpendicular is about 1° to 8°.

8. The end effector of claim 1, said end effector having an intrusion of between about 1 mm to about 2 mm onto a back surface of the wafer.

9. An end effector for supporting one or more semiconductor wafers comprising:

two parallel, grooved engaging rails having corresponding linearly aligned angled grooves adapted to engage and support a wafer at an angle $\theta$ from perpendicular to said rails;

means for rigidly supporting said parallel rails in a parallel configuration, a non-symmetrical gripper means for association with said grooves holding said wafer at the angle $\theta$ from a perpendicular with substantially no movement of the wafer in the grooves during wet processing; and, one or more semiconductor wafers.

10. A method for supporting one or more semiconductor wafers during wet processing with only two points of contact, comprising:

engaging one or more wafers with two parallel, grooved engaging rails having corresponding linearly aligned angled grooves adapted to engage and support a wafer at an angle $\theta$ from perpendicular to said rails;

rigidly supporting said parallel rails in a parallel configuration; and non-symmetrically gripping said wafer holding said wafer at the angle $\theta$ from perpendicular with substantially no movement of the wafer in the grooves during wet processing.

* * * * *